(12) United States Patent
Boudry et al.

(10) Patent No.: US 10,670,744 B2
(45) Date of Patent: Jun. 2, 2020

(54) CURRENT MEASUREMENT IN AN IMAGING SYSTEM

(71) Applicant: General Electric Company, Schenectady, NY (US)

(72) Inventors: John Moore Boudry, Waukesha, WI (US); Ariel Friedlander, Mequon, WI (US)

(73) Assignee: General Electric Company, Schenectady, NY (US)

( * ) Notice: Subject to any disclaimer, the term of this patent is extended or adjusted under 35 U.S.C. 154(b) by 221 days.

(21) Appl. No.: 15/791,212

(22) Filed: Oct. 23, 2017

(65) Prior Publication Data

US 2019/0120981 A1   Apr. 25, 2019

(51) Int. Cl.
| | | |
|---|---|---|
| *A61B 6/03* | (2006.01) | |
| *G01T 7/00* | (2006.01) | |
| *G01T 1/29* | (2006.01) | |
| *G01R 19/00* | (2006.01) | |
| *G06T 11/00* | (2006.01) | |

(52) U.S. Cl.
CPC .......... *G01T 7/005* (2013.01); *G01R 19/0092* (2013.01); *G01T 1/2985* (2013.01); *G06T 11/003* (2013.01); *G06T 11/005* (2013.01); *G06T 2210/41* (2013.01); *G06T 2211/408* (2013.01); *G06T 2211/421* (2013.01); *G06T 2211/424* (2013.01)

(58) Field of Classification Search
CPC ......... A61B 6/582; A61B 6/585; A61B 6/586; A61N 5/10; A61N 5/1048; A61N 5/1065; A61N 5/1067; A61N 5/107; A61N 5/1075; A61N 2005/1061; G01D 18/002; G01D 18/004; G01D 18/008; G01N 27/4163; G01N 27/4175; G01N 2001/2893; G01N 2223/3037; G01T 1/40; G09B 23/28; G09B 23/286
See application file for complete search history.

(56) References Cited

U.S. PATENT DOCUMENTS

| | | | | |
|---|---|---|---|---|
| 4,973,111 | A * | 11/1990 | Haacke | G01R 33/56 324/309 |
| 7,920,906 | B2 * | 4/2011 | Goode, Jr. | A61B 5/0031 600/345 |
| 8,100,584 | B2 | 1/2012 | Friedlander et al. | |
| 2007/0217573 | A1 * | 9/2007 | Bernhardt | A61B 6/4035 378/98.12 |
| 2010/0246754 | A1 * | 9/2010 | Morton | A61B 6/032 378/9 |
| 2011/0091017 | A1 | 4/2011 | Friedlander et al. | |
| 2015/0196265 | A1 * | 7/2015 | Suzuki | G06K 9/6262 378/37 |
| 2017/0273657 | A1 * | 9/2017 | Goto | A61B 6/582 |
| 2018/0344268 | A1 * | 12/2018 | Koehler | A61B 6/4035 |

* cited by examiner

*Primary Examiner* — David P Porta
*Assistant Examiner* — Mamadou Faye
(74) *Attorney, Agent, or Firm* — McCoy Russell LLP

(57) ABSTRACT

Methods and systems are provided for indirectly measuring a current of a radiation source. In one embodiment, a method comprises generating a scan dataset by transmitting a radiation from a radiation source directly to a detector; calculating a signal to noise ratio of the scan dataset; and determining a current that was used to generate the scan dataset based on the calculated signal to noise ratio. In this way, current of the radiation source may be evaluated without connecting extra equipment to the radiation source.

18 Claims, 7 Drawing Sheets

| Prescribed kV | Prescribed mA | | | | | | | |
|---|---|---|---|---|---|---|---|---|
| | 75mA | 100mA | 200mA | 300mA | 400mA | 500mA | 600mA | 700mA |
| 70kV | X | X | X | X | X | X | | |
| 80kV | X | X | X | X | X | X | X | |
| 100kV | X | X | X | X | X | X | X | X |
| 120kV | X | X | X | X | X | X | X | |
| 140kV | X | X | X | X | X | X | | |

FIG. 4A

| Parameter | Value |
|---|---|
| Scan Mode | Static |
| Scan Time | 1 second |
| Focal Spot Size | Large |
| Number of Detector Rows | 64 |
| Detector Row Width | 0.625 mm |
| Trigger Frequency | 984 Hz |
| Gantry Filter | Air |

FIG. 4B

CURRENT MEASUREMENT IN AN IMAGING SYSTEM

FIELD

Embodiments of the subject matter disclosed herein relate to imaging systems, and more particularly, to assessing of an operating current with an imaging system.

BACKGROUND

Noninvasive imaging modalities may transmit energy in the form of radiation into an imaging subject. Based on the transmitted energy, images may be subsequently generated indicative of the structural or functional information internal to the imaging subject. During the imaging process, a part of the transmitted energy may be deposited within the imaging subject. The quantity of the transmitted energy needs to be controlled to achieve high image quality with low level energy deposition.

Regulations require that the energy or dose being generated by an imaging system be periodically evaluated to confirm that the actual dose of the imaging system corresponds to the dose that is prescribed or specified. For example, in a computed tomography (CT) imaging system, operating parameters related to radiation dose, including the operating current and the commanded voltage of the X-ray source, and the exposure time, may be evaluated regularly over the lifetime of the system.

Evaluation of the operating current of the CT imaging system may require connecting a digital voltmeter or oscilloscope to the X-ray generation mA testing point of the CT imaging system, and measuring an average current according to a predetermined protocol. However, such evaluation may be both costly and time consuming.

BRIEF DESCRIPTION

In one embodiment, a method comprises generating a scan dataset by transmitting a radiation from a radiation source directly to a detector; calculating a signal to noise ratio of the scan dataset; and determining a current of the radiation source that is used for generating the scan dataset based on the calculated signal to noise ratio. In this way, operating current of the imaging system may be automatically and indirectly evaluated without connecting extra equipment to the imaging system.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIG. 4A shows an example of prescribed commanded voltage and operating current for generating a calibration curve.

FIG. 4B shows an example of operating parameters for generating the calibration curve.

DETAILED DESCRIPTION

Figure 5:
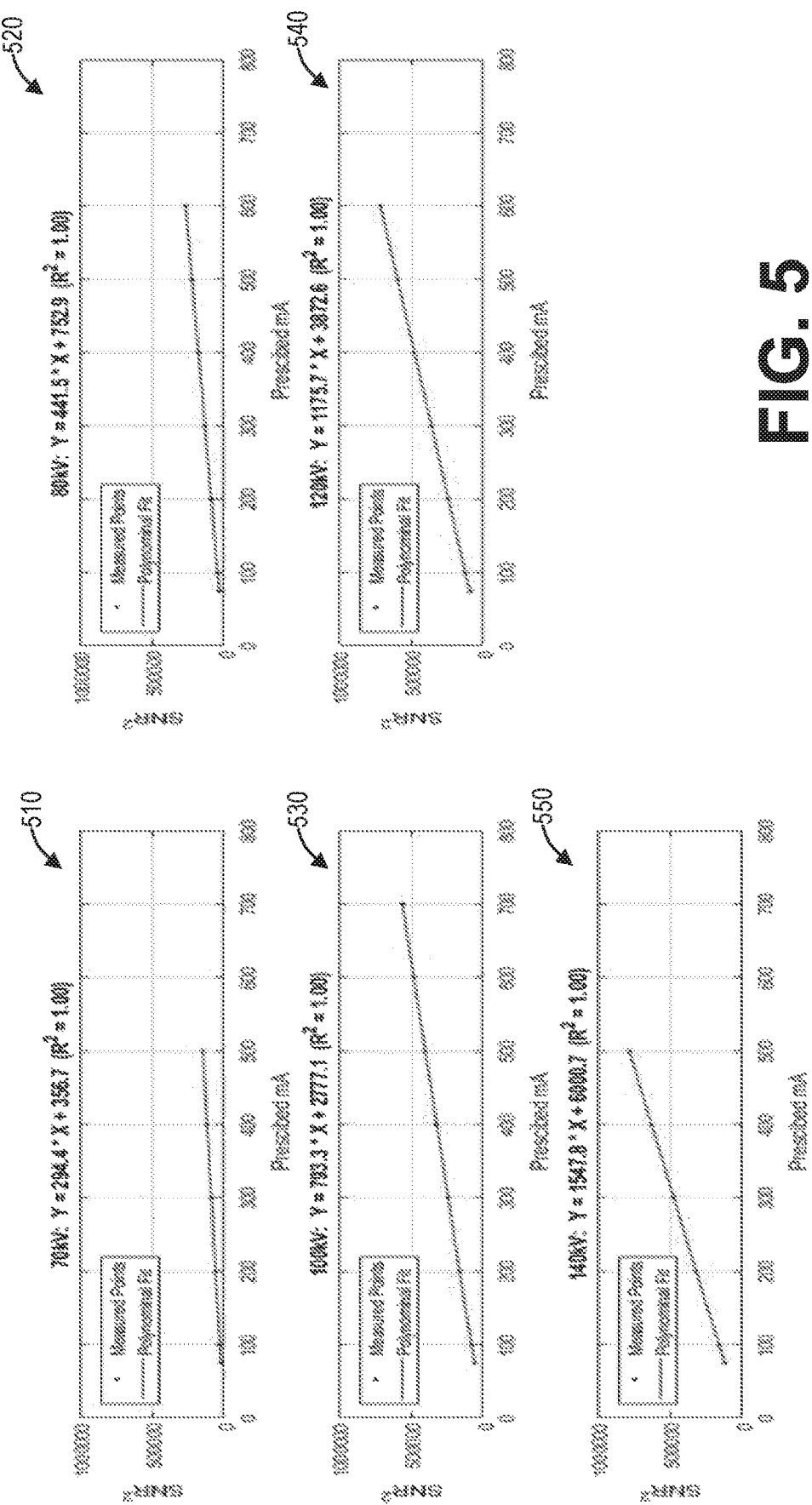
FIG. 5 shows an example of fitting the signal to noise ratios of the scan datasets with the calibration curve.
Figure 6:
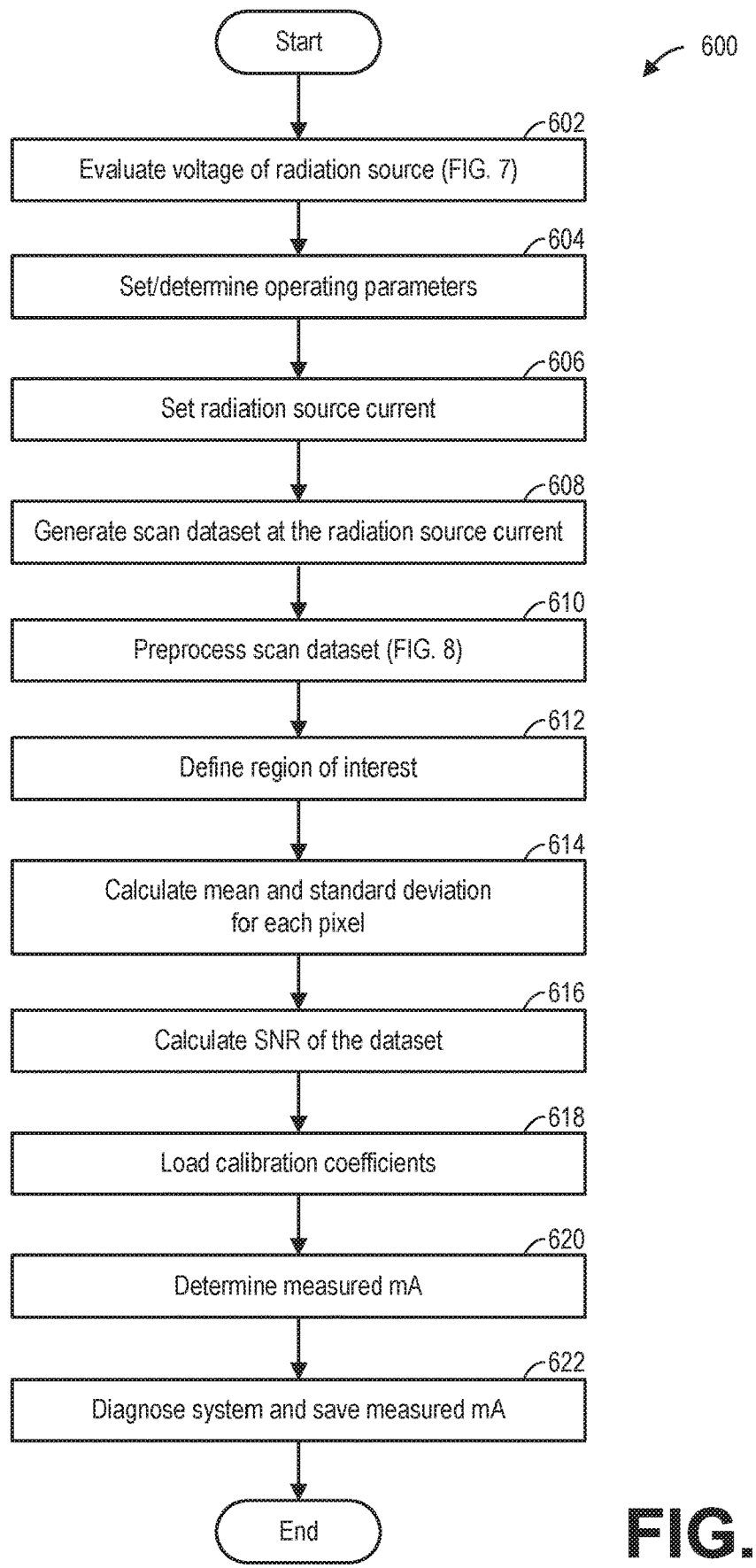
FIG. 6 shows an example method for measuring a current of a radiation source within the imaging system of FIG. 2.
Figure 7:
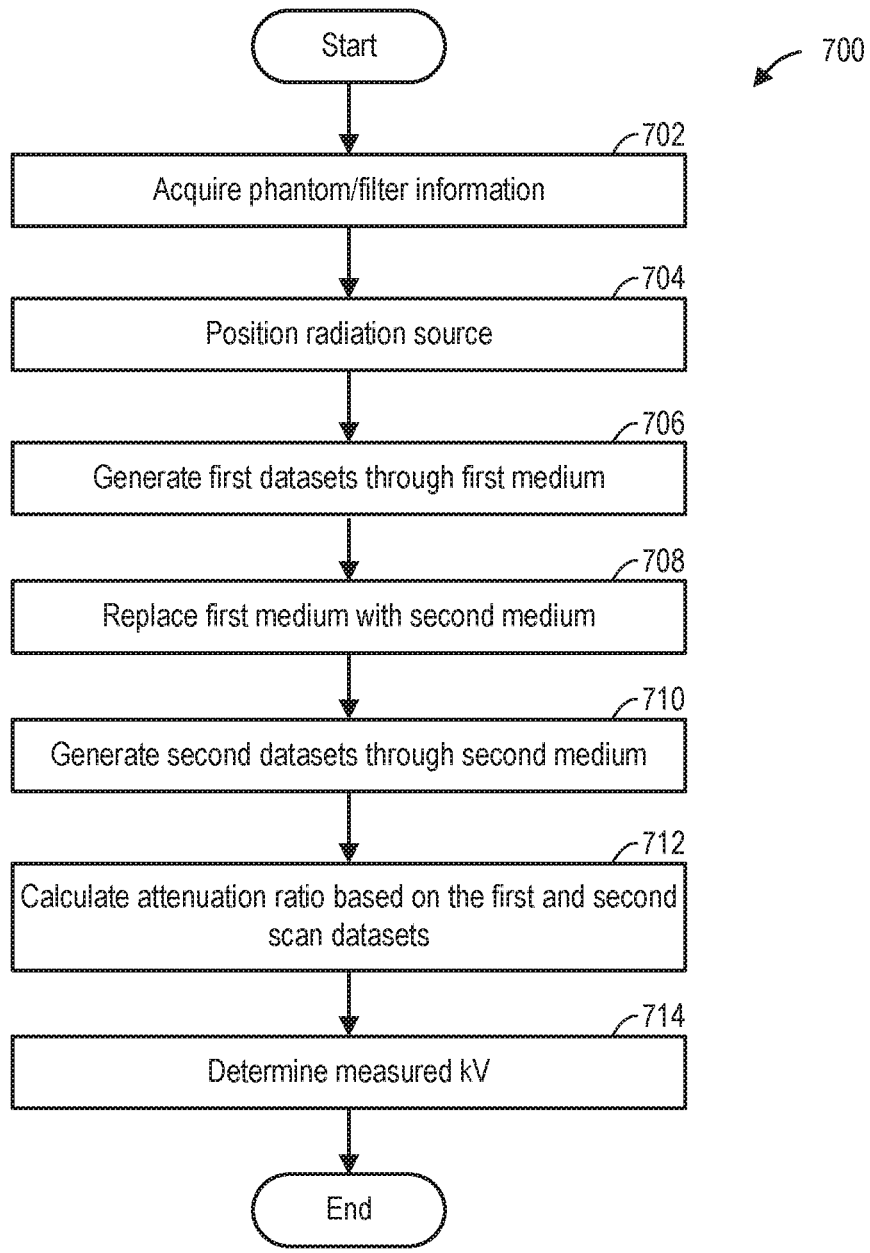
FIG. 7 shows an example method for measuring a voltage of the radiation source.
Figure 8:
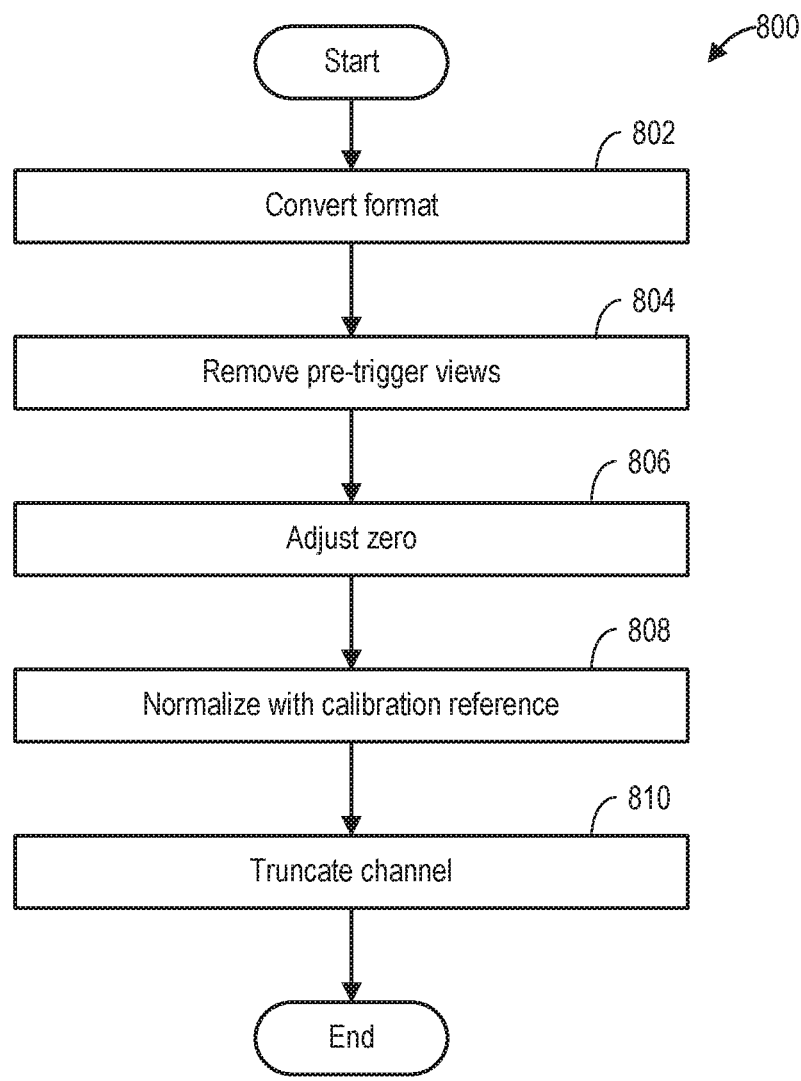
FIG. 8 shows an example method of preprocessing a raw scan dataset for subsequent image processing.

The following description relates to various embodiments of evaluating an operating current of an imaging system. In particular, systems and methods are provided for indirectly calculating the operating current of the radiation source based on scan dataset acquired by the imaging system. As an example, the imaging system may be a computed tomography (CT) imaging system shown in FIGS. 1 and 2. The scan dataset may be acquired by directly transmitting radiation from a radiation source to a detector. The current of the radiation source for generating the scan dataset may be calculated based on the signal to noise ratio (SNR) of the scan dataset and predetermined coefficients of a calibration curve. FIG. 3 shows an example method for generating the calibration curve. Specifically, a plurality of scan datasets are acquired at a plurality of radiation source currents. The SNR of each of the plurality of scan datasets is calculated. The squares of SNR are fitted to generate a calibration curve. Example operating parameters for generating the calibration curve are shown in FIG. 4A and FIG. 4B. FIG. 5 shows example calibration curves for different radiation source voltages. As shown in FIG. 6, coefficients of the calibration curve may be saved in the imaging system for indirectly measuring and evaluating the current of the radiation source. Specifically, during radiation source current evaluation, the current for generating a scan dataset may be measured based on the square SNR of the scan dataset and the coefficients of the calibration curve. In one embodiment, the radiation source voltage may be evaluated before evaluating the radiation source current. FIG. 7 shows an example method for measuring radiation source voltage. FIG. 8 is an example method for preprocessing raw scan datasets acquired from the detector for subsequent calculation of SNR.

Figure 1:
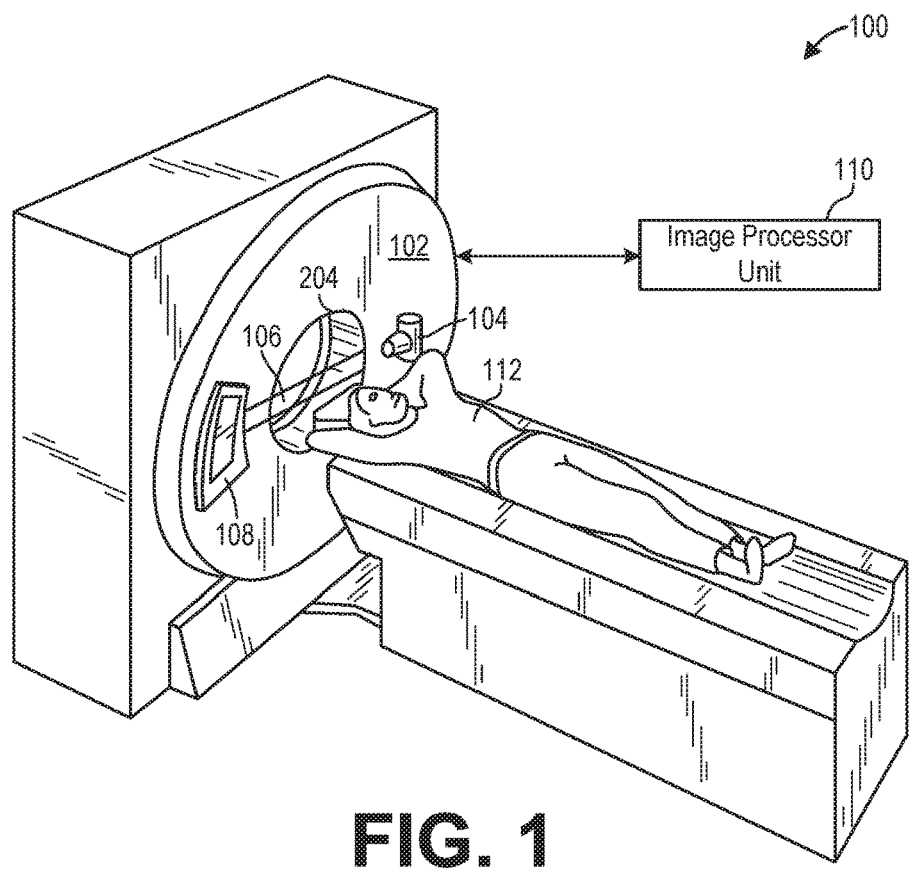
FIG. 1 shows a pictorial view of an imaging system according to an embodiment of the invention.

FIG. 1 illustrates an exemplary CT system 100 configured to allow fast and iterative image reconstruction. Particularly, the CT system 100 is configured to image an object such as a patient, an inanimate object, one or more manufactured parts, and/or foreign objects such as dental implants, stents, and/or contrast agents present within the body. In one embodiment, the CT system 100 includes a gantry 102, which in turn, may further include at least one x-ray radiation source 104 configured to project a beam of x-ray radiation 106 for use in imaging the patient. The gantry may include a bore for receiving the imaging subject, such as patient 112. The radiation source 104 may be configured to project the x-rays 106, through bore 204, towards a detector array 108 positioned on the opposite side of the gantry 102. A bowtie filter (not shown) may be positioned within the gantry, between the radiation source and the imaging subject, to adjust the spatial distribution of radiation energy through the imaging subject. Although FIG. 1 depicts only a single radiation source 104, in another embodiment, a plurality of radiation sources may be employed to project a plurality of x-rays 106 for acquiring projection data corresponding to the patient 112 at different energy levels.

The CT system of FIG. 1 may be used for dual-energy CT imaging, wherein the projection data is acquired by transmitting radiation with two energy levels. In one embodiment, two radiation sources may be used for the dual-energy CT imaging, wherein radiation beams with two energy levels are generated from the two radiation sources supplied with different voltage levels. In another embodiment, dual-energy CT imaging may be achieved by rapidly switching a commanded voltage of one radiation source between two voltage levels. For example, the commanded voltage may be in the form of a square wave. The dual-energy CT imaging may improve contrasts between different issue types and enhance the contrast of the contrast agent.

In certain embodiments, the CT system 100 further includes an image processing unit 110 configured to reconstruct images of a target volume of the patient using an iterative or analytic image reconstruction method. For example, the image processing unit 110 may use an analytic image reconstruction approach such as filtered backprojection (FBP) to reconstruct images of a target volume of the patient. As another example, the image processing unit 110 may use an iterative image reconstruction approach such as advanced statistical iterative reconstruction (ASIR), conjugate gradient (CG), maximum likelihood expectation maximization (MLEM), model-based iterative reconstruction (MBIR), and so on to reconstruct images of a target volume of the patient.

Figure 2:
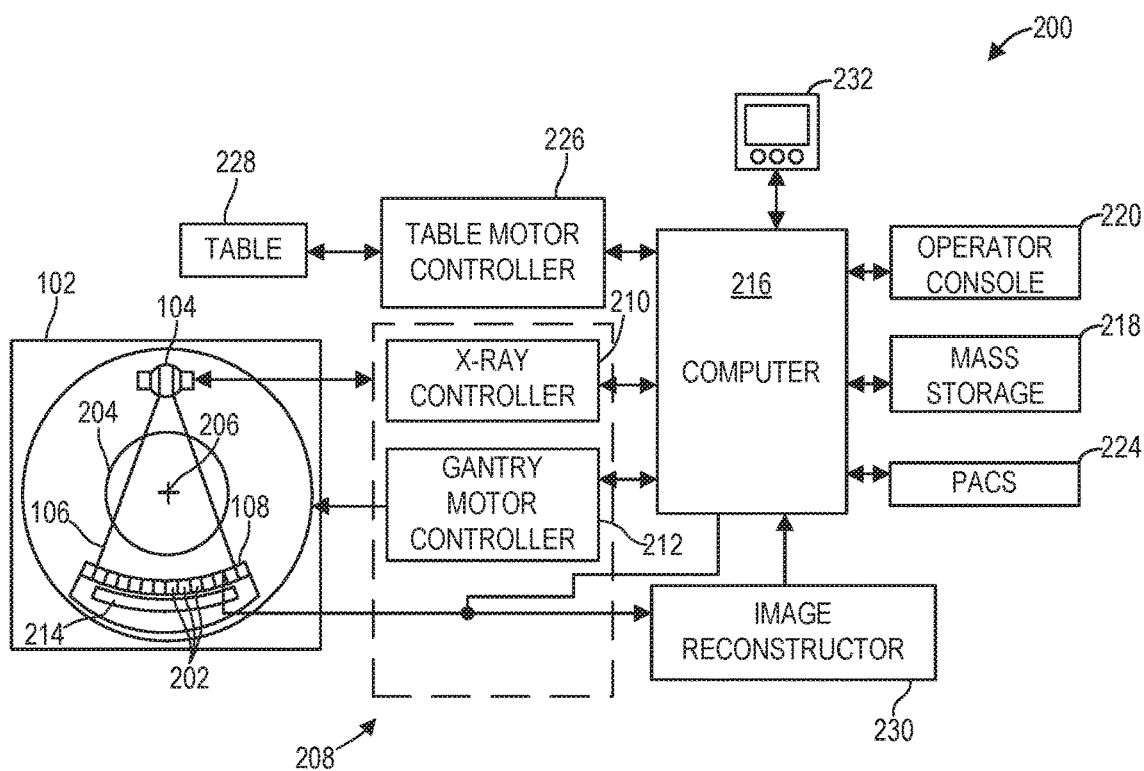
FIG. 2 shows a block diagram of an exemplary imaging system according to an embodiment of the invention.
Figure 3:
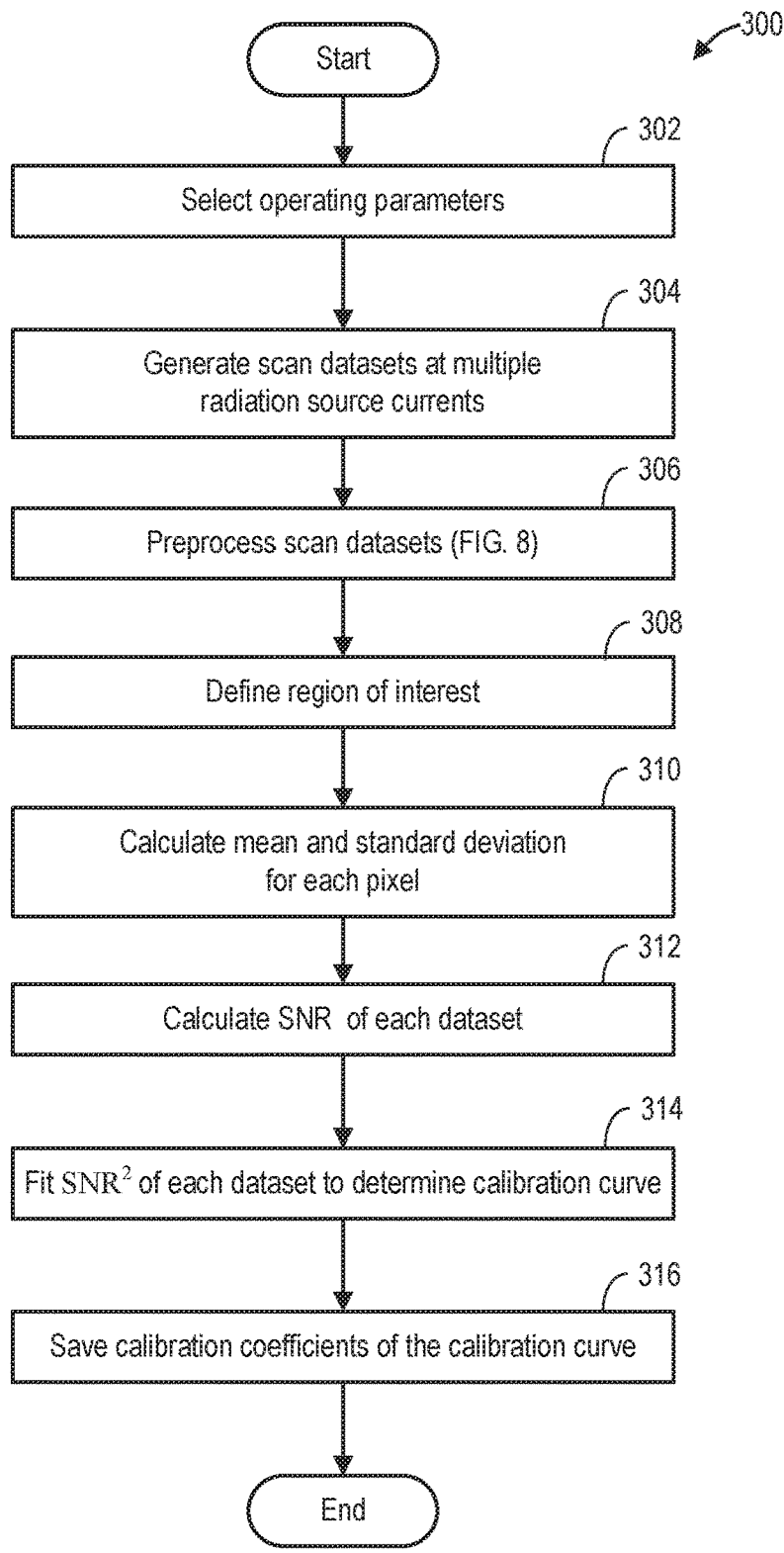
FIG. 3 shows an example method for generating a calibration curve based on scan datasets.

FIG. 2 illustrates an exemplary imaging system 200 similar to the CT system 100 of FIG. 1. In one embodiment, the system 200 includes the detector 108 (see FIG. 1). The detector 108 further includes a plurality of detector elements 202 that together sense the x-ray beams 106 (see FIG. 1) that pass through bore 204. Accordingly, in one embodiment, the detector 108 is fabricated in a multi-slice configuration including the plurality of rows of cells or detector elements 202. In such a configuration, one or more additional rows of the detector elements 202 are arranged in a parallel configuration for acquiring the projection data. The projection data acquired by the detector at one time point is a two-dimensional dataset including a channel dimension and a row dimension. Each pixel in the two-dimensional dataset corresponds to the amount of radiation received at a specific area of the detector array. The specific area may include one or more detector elements 202.

In certain embodiments, the system 200 is configured to traverse different angular positions around the imaging subject for acquiring desired projection data. Accordingly, the gantry 102 and the components mounted thereon may be configured to rotate about the center of rotation 206 for acquiring the projection data, for example, at different energy levels. Alternatively, in embodiments where a projection angle relative to the imaging subject varies as a function of time, the mounted components may be configured to move along a general curve rather than along a segment of a circle.

In one embodiment, the system 200 includes a control mechanism 208 to control movement of the components such as rotation of the gantry 102 and the operation of the x-ray radiation source 104. In certain embodiments, the control mechanism 208 further includes an x-ray controller 210 configured to provide power and timing signals to the radiation source 104. Additionally, the control mechanism 208 includes a gantry motor controller 212 configured to control a rotational speed and/or position of the gantry 102 based on imaging requirements.

In certain embodiments, the control mechanism 208 further includes a data acquisition system (DAS) 214 configured to sample analog data received from the detector elements 202 and convert the analog data to digital signals for subsequent processing. The data sampled and digitized by the DAS 214 at a trigger frequency is transmitted to a computing device (also referred to as processor) 216. In one example, the computing device 216 stores the data in a storage device 218. The storage device 218, for example, may include a hard disk drive, a floppy disk drive, a compact disk-read/write (CD-R/W) drive, a Digital Versatile Disc (DVD) drive, a flash drive, and/or a solid-state storage device.

Additionally, the computing device 216 provides commands and parameters to one or more of the DAS 214, the x-ray controller 210, and the gantry motor controller 212 for controlling system operations such as data acquisition and/or processing. In certain embodiments, the computing device 216 controls system operations based on operator input. The computing device 216 receives the operator input, for example, including commands and/or scanning parameters via an operator console 220 operatively coupled to the computing device 216. The operator console 220 may include a keyboard (not shown) or a touchscreen to allow the operator to specify the commands and/or scanning parameters.

Although FIG. 2 illustrates only one operator console 220, more than one operator console may be coupled to the system 200, for example, for inputting or outputting system parameters, requesting examinations, and/or viewing images. Further, in certain embodiments, the system 200 may be coupled to multiple displays, printers, workstations, and/or similar devices located either locally or remotely, for example, within an institution or hospital, or in an entirely different location via one or more configurable wired and/or wireless networks such as the Internet and/or virtual private networks.

In one embodiment, for example, the system 200 either includes, or is coupled to, a picture archiving and communications system (PACS) 224. In an exemplary implementation, the PACS 224 is further coupled to a remote system such as a radiology department information system, hospital information system, and/or to an internal or external network (not shown) to allow operators at different locations to supply commands and parameters and/or gain access to the image data.

The computing device 216 uses the operator-supplied and/or system-defined commands and parameters to operate a table motor controller 226, which in turn, may control a motorized table 228. Particularly, the table motor controller 226 moves the table 228 for appropriately positioning the imaging subject in the gantry 102 for acquiring projection data corresponding to the target volume of the imaging subject.

As previously noted, the DAS 214 samples and digitizes the projection data acquired by the detector elements 202. Subsequently, an image reconstructor 230 uses the sampled and digitized x-ray data to perform high-speed reconstruction. Although FIG. 2 illustrates the image reconstructor 230 as a separate entity, in certain embodiments, the image reconstructor 230 may form part of the computing device 216. Alternatively, the image reconstructor 230 may be absent from the system 200 and instead the computing device 216 may perform one or more functions of the image reconstructor 230. Moreover, the image reconstructor 230 may be located locally or remotely, and may be operatively connected to the system 100 using a wired or wireless network. Particularly, one exemplary embodiment may use computing resources in a "cloud" network cluster for the image reconstructor 230.

In one embodiment, the image reconstructor 230 stores the images reconstructed in the storage device 218. Alternatively, the image reconstructor 230 transmits the reconstructed images to the computing device 216 for generating useful patient information for diagnosis and evaluation. In certain embodiments, the computing device 216 transmits the reconstructed images and/or the patient information to a display 232 communicatively coupled to the computing device 216 and/or the image reconstructor 230.

Turing to FIG. 3, an example method 300 for generating calibration coefficients is shown. The method may include generating scan datasets of air at a plurality of current levels, calculating the SNR of each scan dataset, and fitting the squares of SNRs with a calibration curve. Calibration coefficients may be obtained from the calibration curve. The calibration coefficients may be permanently saved in the memory of the imaging system for evaluating the radiation source current. Method 300 may be executed by a processor of an imaging system, such as a processor of computing device 216, according to non-transitory instructions stored in memory of the computing device. In one example, method 300 may be executed during the manufacturing phase, before delivering the imaging system to customers. In another example, calibration curve generated during development phase may be updated during manufacturing.

At 302, operating parameters affecting the radiation source current are selected. The operating parameters may include one or more of a commanded voltage, a focal spot size, and an age of the radiation source. In one embodiment, the operating parameters may be selected through a Design of Experiments (DOE) method. For example, candidate operating parameters may be first selected, and the effect of each candidate operating parameter on the current of the radiation source may then be determined by an ANOVA analysis or other regression method. As such, operating parameters having high impact on the radiation source current may be selected.

At 304, method 300 generates scan datasets of air at a plurality of current levels. The scan datasets of air are generated by emitting radiation from the radiation source to the detector without passing through a bowtie filter or an imaging subject in the bore. The scan datasets are generated by controlling the selected operating parameters at a specific level. The specific level may be determined within and span a system operation range. While generating the scan datasets, the radiation source and the detector are not moved. In other words, the scan datasets are generated without rotating the gantry. As such, the gantry may be positioned at a predetermined set position. The scan datasets corresponds to multiple the two-dimensional digitized projection data acquired via a detector and a DAS (such as detector 108 and DAS 214 of FIG. 2) over time. Each scan dataset is three-dimensional with the dimensions corresponding to detector rows and detector channels (e.g. rows and columns of detector elements), and to views. As such, the channel and row dimensions are spatial dimensions corresponding to an area of the detector. The view dimension corresponds to the time unit of data acquisition and, in imaging implementations where the radiation source and detector rotate, may also correspond to the angular position at which the image data is acquired. However, in embodiments disclosed herein in which the source and detector do not rotate during the current measurement process, the view dimension does not vary with respect to angular position.

FIG. 4A and FIG. 4B show example parameters for generating calibration curves. Specifically, FIG. 4A shows voltage levels and current levels of the radiation source prescribed for generating calibration curves at a plurality of selected voltage levels. Each x indicates one scan dataset acquired at the corresponding voltage and current levels. Specifically, five voltage levels are selected. At each voltage level, scan datasets are acquired at a plurality of current levels. The amplitude and number of the prescribed current levels at each of the prescribed voltage level may be determined by the operating range of the radiation source. As an example, at 70 kV voltage level, one scan dataset is acquired at each of 75 mA, 100 mA, 200 mA, 300 mA, 400 mA, and 500 mA current levels. At 100 kV voltage level, one scan dataset is acquired at each of 75 mA, 100 mA, 200 mA, 300 mA, 400 mA, 500 mA, 600 mA, and 700 mA current levels. FIG. 4B shows setup of additional operating parameters for generating the scan datasets. For example, the scanning mode is set to be static, wherein the radiation source and the detector do not rotate. The scan time is one second. The focal spot size of the X-ray source is set to be large. The number of detector rows and the detector row width are kept at a constant number while generating the plurality of scan datasets. The CT system may be triggered at a 984 Hz frequency. Therefore, during the one second scan time, 984 views are acquired. The gantry filter is set to be air, as the bowtie filter is removed.

At 306, the generated scan datasets are preprocessed for subsequent calculation. Method 800 of FIG. 8 presents the preprocessing procedures in detail.

At 308, method 308 defines a region of interest (ROI). The ROI may be defined by the channel and the row dimension. In one example, the ROI may correspond to projection data acquired at an area of the detector array (such as detector 108 of FIG. 2) where pixels are determined to be stable. The area may not be continuous. In another example, the ROI may correspond to the projection data acquired at the isocenter of detector array. In one example, the ROI may include all the channels and rows of the scan dataset. In another example, the ROI may include a part of the channels or a part of the rows of the scan dataset.

At 310, the mean and standard deviation of each pixel in the ROI are calculated along the view dimension (e.g., over time). For example, the pixel at a specific channel and a specific row within the ROI are averaged over the view dimension. The mean is then assigned to the pixel at the specific channel and the specific row. Similarly, the standard deviation of a pixel at a specific channel and a specific row within the ROI are calculated over the view dimension (over time). The calculated standard deviation is assigned to the pixel at the specific channel and the specific view. As a result, two two-dimensional matrixes are generated. One of them is a matrix of means. The other a matrix of standard deviations. Both matrixes have a channel dimension and a row dimension of the same size as the channel dimension and the row dimension of the scan dataset.

At 312, method 300 calculates the SNR of each scan dataset. In one embodiment, the SNR of each pixel in the ROI may first be calculated by dividing the mean by the standard deviation of the pixel. For example, a SNR matrix may be calculated by dividing each element in the matrix of means by the corresponding element in the matrix of standard deviation. The SNR of the scan dataset may then be calculated by taking the mean of SNRs of all the pixels in the ROI. For example, the SNR of the scan dataset may be calculated by taking the mean of all the elements in the SNR matrix.

At 314, the SNR of each scan dataset is squared, and the squares of SNRs ($SNR^2$s) are fitted to determine a calibration curve. For example, $SNR^2$s of scan datasets generated at a plurality of radiation source current levels and at a constant operating parameter level are curve-fitted. The calibration curve may be defined by its coefficients.

In one embodiment, $SNR^2$s collected at one commanded voltage level of the radiation source may be fitted with a linear curve. FIG. 5 shows the fitting results for the scan datasets generated with operating parameters in FIG. 4A and FIG. 4B. Each plot (510, 520, 530, 540, and 550) shows the $SNR^2$s of the scan datasets generated at one voltage level. The $SNR^2$s are fitted with a linear curve. The linear curve is defined by its coefficients: slope and offset. For example, the linear curve fitted at 70 kV voltage level has a slope of 294.4 and an offset of 356.7. The fitting results show that the $SNR^2$ of the scan dataset is in a linear relationship with the radiation source current for generating the scan dataset. The slope and the offset of the linear calibration curves increase with increased voltage levels of the radiation source.

In another embodiment, calibration curves may be generated at different levels of an operating parameter other than the commanded voltage of the radiation source. The $SNR^2$s of the scan datasets may then be fitted with a non-linear curve, such as a higher order polynomial. As an example, the calibration curve may be determined via a DOE method.

At 316, calibration coefficients of the calibration curves and the corresponding operating parameters under which the calibration curve are generated may be saved. As one example, the slope and offset of the linear calibration curves from FIG. 5 may be saved together with the operating parameters used for generating the coefficients (such as the operating parameters in FIG. 4A and FIG. 4B).

In another embodiment, method 300 may generate calibration coefficients for a dual-energy CT system. As one example, a calibration curve may be generated for each commanded voltage level of the radiation source. As another example, one calibration curve may be generated with weighted $SNR^2$s of the scan datasets acquired with different radiation levels (or difference voltage levels of the commanded voltage). The $SNR^2$s may be weighted with a duty cycle of the commanded voltage.

FIG. 6 shows an example method 600 for evaluating operating current of the radiation source based on the SNR of the scan dataset and the predetermined coefficients. As one example, the predetermined coefficients may be the calibration coefficients generated from a calibration process illustrated in FIG. 3. The current evaluation is based on the assumption that the radiation energy generated from a radiation source is proportional to the current of the radiation source, and the amplitude of the signal acquired by the detector is proportional to the generated radiation energy.

The procedures for implementing method 600 may be saved in a non-transitory memory of the imaging system. Upon request, the current evaluation procedures may be automatically executed without physically connecting additional equipment to the imaging system. In one example, method 600 may be executed during system inspection.

At 602, method 600 may optionally evaluates the voltage of the radiation source based on the attenuation ratio of the radiation transmitted through a phantom. Details of the radiation source voltage evaluation are presented in FIG. 7.

At 604, the operating parameters may be set or determined. For example, the operating parameters (such as the focal spot size) may be set according to a predetermined current evaluation protocol. The operating parameters are kept constant during the radiation source current evaluation. As one example, the operating parameters may include the commanded voltage and the focal size of the radiation source. The operating parameters may also include parameters listed in FIG. 4B, such as the scan mode, the scan time, the number of detector rows, the detector row width, the trigger frequency, and the gantry filter status. Further, method 600 may determine operating parameters including the age of the radiation source.

At 606, method 600 sets the operating current of the radiation source. The operating current may be set to be one of the operating currents selected during the calibration process of FIG. 3. The operating current may also set to be any current in the operating range of the system.

At 608, scan dataset of air is generated at the operating current set at 604, with operating parameters set at 602. As an example, radiation may be emitted from one or more radiation source by supplying the radiation source with the operating current and the commanded voltage. The radiation transmitted through air is acquired by the detector without passing through a bowtie filter or an imaging subject in the bore. The scan dataset is generated by digitizing the signal acquired by the detector. While generating the scan dataset, the radiation source and the detector are not moved or rotated. In other words, the scan datasets are generated without rotating the gantry. As such, the gantry may be positioned at a predetermined set position. Each scan dataset is three-dimensional with the dimensions corresponding to detector rows and detector channels (e.g. rows and columns of detector elements), and to views. As such, the channel and row dimensions are spatial dimensions corresponding to an area of the detector. The view dimension corresponds to the time unit of data acquisition.

At 610, the scan dataset is preprocessed according to method 800 of FIG. 8. The scan dataset is preprocessed so that the resulting signal is proportional to the energy from the radiation source.

At 612, similar to 308 of FIG. 3, a ROI is defined in the scan dataset. The ROI may be defined by the channel and the row dimension. In one example, the ROI may correspond to projection data acquired at an area of the detector array (such as detector 108 of FIG. 2) where pixels are determined to be stable. The area may not be contiguous. In another example, the ROI may correspond to the isocenter of detector array. The ROI may be the same region as defined during the calibration of FIG. 3. The ROI may alternatively be different from the ROI defined during the calibration of FIG. 3.

At 614, similar to 310 of FIG. 3, the mean and standard deviation are calculated along the view dimension at each pixel within the ROI. For example, the pixel at a specific channel and a specific row in the ROI are averaged over the view dimension (over time). The mean is then assigned to the pixel at the specific channel and the specific row. Similarly, the standard deviation of the pixel at a specific channel and a specific row in the ROI are calculated over the view dimension (over time). The calculated standard deviation is assigned to the pixel at the specific channel and the specific view. As a result, two two-dimensional matrixes are generated. One of them is a matrix of means. The other a matrix of standard deviations. Both matrixes have a channel dimension and a row dimension being the same size as the channel dimension and the row dimension of the scan dataset.

At 616, similar to 312 of FIG. 3, SNR of the dataset is calculated. In one embodiment, the SNR at each pixel in the ROI may first be calculated by dividing the mean by the standard deviation at the pixel. For example, a SNR matrix may be calculated by dividing each element in the matrix of means by the corresponding element in the matrix of standard deviation. The SNR of the scan dataset is calculated by taking the mean of SNRs of all the pixels in the ROI. For example, the SNR of the scan dataset may be calculated by taking mean of all the elements in the SNR matrix.

At 618, method 600 loads predetermined coefficients of the calibration curve corresponding to the operating parameters set at 604. For example, a computing device (such as computing device 216) may compare the values of the operating parameters set at 604 with the values of the saved operating parameter values. If a match is determined, the computing device loads the corresponding calibration coefficients from the memory.

In another embodiment, if the value of the operating parameter set at 604 is different from the value of the operating parameter for generating the calibration coefficients, the computing device may load the calibration coefficients generated at a saved operating parameter value different from the one used for current evaluation (radiation source current used for generate the scan dataset at 608). The computing device may adjust the loaded calibration coefficients based on the difference between the saved operating parameter value and the one used for current evaluation. For example, if a first set of calibration coefficients are generated at a first voltage level, a second set of calibration coefficients are generated at a second voltage level, and the scan dataset for current evaluation is generated at a third voltage level, wherein the third voltage level is closer to the first voltage level than to the second voltage level. The computing device may load the first set of calibration coefficients and adjust the loaded coefficients based on the difference between the first voltage level and the third voltage level. For example, the loaded coefficients may be weighted by the difference between the first and the third voltage levels. Alternatively, both the first and the second sets of calibration coefficients may be loaded, and the calibration coefficients for the current evaluation may be calculated by interpolating the first and the second sets of the calibration coefficients based on the difference of the third voltage level relative to the first and the second voltage levels.

In yet another embodiment, if the system does not pass the voltage evaluation at 602, the computing device may adjust the loaded calibration coefficients based on the difference between a measured voltage and a prescribed radiation source voltage during the voltage evaluation. For example, the loaded calibration coefficients may be scaled by the difference between the measured voltage and the prescribed voltage.

At 620, method 600 determines a measured operating current based on the calibration coefficients loaded at 618 and the $SNR^2$ of the scan dataset calculated at 616. In one example, the measured current may be determined with loaded calibration coefficients if levels of the operating parameters for current evaluation are the same as levels of the operating parameters for generating the calibration coefficients. In another example, the measured current may be determined with adjusted calibration coefficient based on the difference between the value of the operating parameters for current evaluation and the value of the operating parameters for generating the calibration coefficients.

In one embodiment, for the dual-energy CT system, wherein the scan dataset is generated by switching a commanded voltage of the radiation source between a first voltage level and a second voltage level, the measured current may be determined based on the duty cycle of the commanded voltage. As one example, a first SNR of the scan dataset generated with the first voltage level and a second SNR of the scan dataset generated with the second voltage level may be calculated. The SNR of scan dataset generated with the commanded voltage may then be calculated by weighting the first SNR and the second SNR based on a duty cycle of the commanded voltage. For example, the first SNR may be weighted by the duty cycle and the second SNR may be weighted by the difference between 1 and the duty cycle. The measured current may be determined based on the calculated SNR of the dataset generated with the commanded voltage.

As another example, a first current level corresponding to the scan dataset generated with the first voltage level and a second current level corresponding to the scan dataset generated with the second voltage level may be calculated based on the loaded calibration coefficients for the first and the second voltage levels. The measured current corresponding to the dataset generated with the commanded voltage may then be calculated by weighting the first current level and the second current level based on a duty cycle of the commanded voltage. For example, the first current level may be weighted by the duty cycle and the second current level may be weighted by the difference between 1 and the duty cycle.

At 622, the measured operating current may be saved in the system memory. Further, the measured operating current may be evaluated by comparing the measured operating current with the current set at 604. For example, responsive to the measured operating current being different from the current set at 604, or out of a threshold range around the current set at 604, method 600 may determine the radiation source does not meet the current evaluation. Responsive to the measured operating current being the same as the current set at 604, or within a threshold range around the current set at 604, method 600 may determine the radiation source passed the current evaluation. Method 600 may further log the current evaluation results in a diagnose file. If the imaging system does not pass the current evaluation, the imaging system may be adjusted (e.g., parts replaced, calibrated) so that the current actually output by the system matches the commanded current. Additionally or alternatively, the measured current may be output on a display device for an operator to view.

FIG. 7 shows an example method 700 for evaluating the voltage of the radiation source. The voltage of the radiation source may be measured based on a measured attenuation ratio of a phantom or filter with known attenuation ratio.

At 702, method 700 acquires the identification information about the attenuating medium. For example, a serial number or other identifier for a phantom 18 or bowtie filter 80, may be acquired (block 120). Such information may be acquired for administrative purposes, such as to generate a report related to the voltage measurement event for regulatory or archival purposes.

At 704, the radiation source may be positioned. For example, the radiation source may be positioned at the top of the gantry, if it has not already been moved to the correct location. As noted herein, in certain implementations data acquisition occurs with the radiation source positioned at one location (such as at the top of the gantry), with no rotation or other movement of radiation source during data acquisition.

At 706, a first dataset is generated through a first attenuating medium. The first attenuation medium may be an attenuator phantom or the center or edge of a bowtie filter.

In one implementation, four scans are taken of the first attenuating medium at prescribed voltage levels, such as respective scans at 80 kV, 100 kV, 120 kV, and 140 kV, with each scan constituting a respective first dataset. Further, in one such implementation, the current used in operating the radiation source is kept constant and at a low value (e.g., approximately 50 mA) to reduce ripple effects.

At 708, after data acquisition using the first attenuating medium, the first attenuating medium is replaced or adjusted so that the second attenuating medium is in the scan path. In one embodiment, the phantom or bowtie filter may be removed so that the second attenuating medium is air.

At 710, once the second attenuating medium is positioned, a second datasets are acquired through the second attenuating medium at the same respective voltages as utilized in acquiring the first dataset at 706. For example, in one implementation, four scans are taken of the second attenuating medium at respective voltages of 80 kV, 100 kV, 120 kV, and 140 kV and the data associated with these four scans constitutes the second datasets. Thus, two or more of the first and second datasets are generated using different attenuating media.

At 712, an attenuation ratio may be calculated. For example, each pixel of the first dataset may be divided by the corresponding pixel of the second dataset acquired at the same voltage level to generate an attenuation ratio matrix. A single attenuation ratio may then be calculated by taking the mean of all the pixels of the attenuation ratio matrix.

At 714, a measured voltage may be derived by taking the natural logarithm of the attenuation ratio and fitting mathematically with a polynomial curve. Method 700 may further include comparing the measured voltage with the prescribed voltage for generating the first and the second datasets. Responsive to the difference between the measured and the prescribed voltage within a threshold range, method 700 may determine that the imaging system passes the voltage evaluation. Responsive to the difference between the measured and the prescribed voltage greater a threshold range, method 700 may determine that the imaging system does not pass the voltage evaluation. Method 700 may further log the current evaluation results in a diagnose file.

If the imaging system does not pass the voltage evaluation, the calibration coefficients for the subsequent current evaluation may be adjusted based on the difference between the measured and the prescribed voltage. For one example, the coefficients may be weighted based on the difference. In another embodiment, if the imaging system does not pass the voltage evaluation, the radiation source voltage set for generating the scan dataset (608 of FIG. 6) may be adjusted based on the difference between the measured and the prescribed voltage in the voltage evaluation. For example, during current evaluation, the prescribed radiation source voltage may offset from a target voltage by the difference. In this way, radiation at the target voltage level is emitted.

FIG. 8 shows an example method 800 for preprocessing the raw scan dataset acquired by the detector of the imaging system for subsequent processing.

At 802, method 800 converts the format of the raw scan dataset. For example, method 700 may convert the datasets from a FFP or hybrid FFP format (e.g., a lossy compression scheme) to a floating point format.

At 804, pre-trigger views of the raw scan dataset may be removed. The pre-trigger views are datasets acquired before triggering the radiation emission.

At 806, the zero level of the raw scan dataset is adjusted. The zero level of the raw scan dataset may be adjusted to remove noise. As an example, a dark image (i.e., the data acquired by the detector when X-rays are being generated, also known as the offset or dark current) may be subtracted from the raw scan dataset.

At 808, the dataset is normalized with a calibration reference. For example, the dataset acquired from each channel of the detector may be divided by corresponding data value stored in a detector left reference channel, where the stored data value relates to noise data.

At 810, channel truncation may be performed in which a dataset acquired by non-image generating channels of the detector (such as end channels and other non-image channels) may be removed.

The above preprocessing steps of method 800 may be executed in a different sequence from the one presented in FIG. 8. Further, one or more steps may be skipped.

In this way, the current of the radiation source in the imaging system may be evaluated directly based on the SNR of the scan dataset. The technical effect of calculating the operating current of the imaging system based on the SNR of the scan dataset is that no extra equipment is required to be physically connected to the imaging system to measure the current, and current evaluation may be performed automatically by the imaging system. Further, the method may be used for evaluating current of dual-energy radiation source. The technical effect of evaluating the current under specific commanded voltage level of the X-ray source is that the SNR of the scan dataset is of linear relationship with the square root of the operating current. The technical effect of evaluating the radiation source voltage prior to evaluating the radiation source current is that the result of the radiation source voltage evaluation may be utilized to accurately perform the radiation source current evaluation.

In one embodiment, a method comprises, generating a scan dataset by transmitting radiation from a radiation source directly to a detector; calculating a signal to noise ratio of the scan dataset; and determining a current of the radiation source that was used for generating the scan dataset based on the calculated signal to noise ratio. In a first example of the method, wherein the radiation is transmitted from the radiation source to the detector without passing through a bowtie filter. A second example of the method optionally includes the first example and further includes, wherein the radiation is transmitted from the radiation source to the detector without passing through an imaging subject in a bore. A third example of the method optionally includes one or more of the first and second examples, further comprising determining the current based on a square of the signal to noise ratio of the scan dataset and a plurality of predetermined coefficients. A fourth example of the method optionally includes one or more of the first through third examples, and further includes, determining the plurality of predetermined coefficients by generating a plurality of additional scan datasets at a plurality of selected currents of the radiation source, prior to generating the scan dataset, fitting squares of the signal to noise ratios of the plurality of scan datasets with a calibration curve, and obtaining the plurality of predetermined coefficients from the calibration curve. A fifth example of the method optionally includes one or more of the first through fourth examples, and further includes, generating the additional scan datasets by transmitting radiation from the radiation source directly to the detector. A sixth example of the method optionally includes one or more of the first through fifth examples, and further includes, selecting an operating parameter by Design of Experiments method, and generating a plurality of calibration curves at a plurality of operating parameter levels. A seventh example of the method optionally includes one or more of the first through sixth examples, and further includes, wherein the system operating parameter includes a focal spot size of the radiation source. An eighth example of the method optionally includes one or more of the first through seventh examples, and further includes, wherein the operating parameter includes a voltage of the radiation source. A ninth example of the method optionally includes one or more of the first through eighth examples, and further includes, wherein the signal to noise ratios of the additional scan datasets are fitted with a linear curve.

In another embodiment, a method comprises generating a plurality of scan datasets of air at a plurality of current levels of one or more radiation sources; fitting squares of signal to noise ratios of the plurality of scan datasets with a calibration curve; during radiation source current evaluation, generating a first scan dataset of air by setting the one or more radiation sources at a first current level; and calculating a second current level of the one or more radiation sources based on a signal to noise ratio of the first scan dataset and coefficients of the calibration curve. In a first example of the method, the method further comprises evaluating a voltage of the one or more radiation sources prior to the radiation source current evaluation. A second example of the method optionally includes the first example and further includes, adjusting the coefficients of the calibration curve based on the radiation source voltage evaluation. A third example of the method optionally includes one or more of the first and second examples, wherein the plurality of the scan datasets of air and the first scan dataset of air are generated with two radiation sources operating at different voltages. A fourth example of the method optionally includes one or more of the first through third examples, and further includes, determining that the one or more radiation sources pass the radiation source current evaluation responsive to the first current level being within a threshold range of the second current level. A fifth example of the method optionally includes one or more of the first through fourth examples, and further includes, wherein the one or more radiation sources and a detector are not moved while generating the plurality of scan datasets and the first scan dataset.

In yet another embodiment, a system comprises a bore for receiving an imaging subject; one or more radiation sources for emitting radiation to the bore; a detector for receiving radiation transmitted through the bore; and a computing device configured with instructions stored in a non-transitory memory for: generating a scan dataset by transmitting radiation from the one or more radiation sources directly to the detector; calculating a signal to noise ratio of the scan dataset; and determining a current level of the one or more radiation sources for generating the scan dataset based on the calculated signal to noise ratio and a plurality of predetermined coefficients. In a first example of the system, the computing device is further configured for diagnosing the system by comparing the measured current level with the prescribed current level. A second example of the system optionally includes the first example and further includes, wherein the plurality of predetermined coefficients are adjusted based on a system operating parameter level. A third example of the system optionally includes one or more of the first and second examples, wherein the system operating parameters include one or more of a voltage of the radiation source, a focal size of the radiation source, and an age of the radiation source.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
during manufacturing of an imaging system with a radiation source,
generating a calibration curve based on a plurality of scan datasets of air at a plurality of selected currents of the radiation source;
during evaluation of an operating current of the radiation source,
generating a scan dataset of air by transmitting radiation from the radiation source directly to a detector;
calculating a signal to noise ratio of the scan dataset of air; and
determining the operating current of the radiation source that was used for generating the scan dataset based on the calculated signal to noise ratio and the calibration curve;
wherein during generating the calibration curve and the evaluation of the operating current, radiation is transmitted from the radiation source to the detector without passing through a bowtie filter and without passing through an imaging subject in a bore.

2. The method of claim 1, further comprising determining the operating current based on a square of the signal to noise ratio of the scan dataset and a plurality of predetermined coefficients.

3. The method of claim 2, wherein the plurality of predetermined coefficients is obtained from the calibration curve; and wherein the calibration curve is determined by fitting squares of signal to noise ratios of the plurality of scan datasets against the plurality of selected currents.

4. The method of claim 1, further comprising generating the plurality of scan datasets of air by transmitting radiation from the radiation source directly to the detector.

5. The method of claim 3, further comprising generating a plurality of calibration curves at a plurality of operating parameter levels.

6. The method of claim 5, wherein an operating parameter includes a focal spot size of the radiation source.

7. The method of claim 5, wherein an operating parameter includes a commanded voltage of the radiation source.

8. The method of claim 1, wherein the calibration curve is a linear curve; and further comprising diagnosing the imaging system based on the operating current.

9. A method, comprising:
prior to radiation source current evaluation,
generating a plurality of scan datasets of air at a plurality of current levels of one or more radiation sources;
fitting squares of signal to noise ratios of the plurality of scan datasets of air against the plurality of current levels with a calibration curve;
determining calibration coefficients from the calibration curve;
during the radiation source current evaluation,
generating a first scan dataset of air by operating the one or more radiation sources at a first current level;
calculating a second current level of the one or more radiation sources based on a signal to noise ratio of the first scan dataset of air and the calibration coefficients of the calibration curve; and
diagnosing the one or more radiation sources by comparing the second current level with the first current level;
wherein the plurality of scan datasets of air and the first scan data set of air are generated by transmitting radiation from the one or more radiation sources directly to a detector without passing through a subject and without passing through a filter.

10. The method of claim 9, wherein the first scan dataset is generated by switching a commanded voltage of the radiation source between a first voltage level and a second voltage level.

11. The method of claim 10, further comprising calculating a first signal to noise ratio of the first scan dataset acquired at the first voltage level, calculating a second signal to noise ratio of the first scan dataset acquired at the second voltage level, and calculating the signal to noise ratio of the first scan dataset by weighting the first signal to noise ratio and the second signal to noise ratio based on a duty cycle of the commanded voltage.

12. The method of claim 10, further comprising calculating a third current level based on a first signal to noise ratio of the first scan dataset acquired at the first voltage level, calculating a fourth current level based on a second signal to noise ratio of the second scan dataset acquired at the second voltage level, and calculating the second current level by weighting the third current level and the fourth current level based on a duty cycle of the commanded voltage.

13. The method of claim 9, further comprising determining that the one or more radiation sources pass the radiation source current evaluation responsive to the first current level being within a threshold range of the second current level.

14. The method of claim 9, wherein the one or more radiation sources and the detector are not moving while generating the plurality of scan datasets and the first scan dataset.

15. A system, comprising:
a bore for receiving an imaging subject;
one or more radiation sources for emitting radiation to the bore;
a detector for receiving radiation transmitted through the bore; and
a computing device configured with instructions stored in a non-transitory memory for:
generating a scan dataset at a first prescribed current level by transmitting radiation from the one or more radiation sources directly to the detector without a subject and without a filter in the bore;
calculating a signal to noise ratio of the scan dataset; and
determining a measured current level of the one or more radiation sources for generating the scan dataset based on the calculated signal to noise ratio and a calibration curve generated prior to generating the scan dataset, the calibration curve generated by fitting squares of signal to noise ratios of a plurality of scan datasets against a plurality of prescribed current levels including the first prescribed current level;
wherein the plurality of scan data sets is generated at the plurality of prescribed current levels without the subject and without the filter in the bore.

16. The system of claim 15, wherein the computing device is further configured for diagnosing the system by comparing the measured current level with a prescribed current level.

17. The system of claim 15, wherein the computing device is further configured for obtaining a plurality of predetermined coefficients from the calibration curve, and wherein the plurality of predetermined coefficients is adjusted based on a system operating parameter level.

18. The system of claim 17, wherein the system operating parameters include one or more of a commanded voltage of the radiation source, a focal size of the radiation source, and an age of the radiation source.

* * * * *